(12) United States Patent
Okazawa et al.

(10) Patent No.: US 6,703,249 B2
(45) Date of Patent: Mar. 9, 2004

(54) METHOD OF FABRICATING MAGNETIC RANDOM ACCESS MEMORY OPERATING BASED ON TUNNEL MAGNETRORESISTANCE EFFECT

(75) Inventors: Takeshi Okazawa, Tokyo (JP); Hideaki Numata, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/125,150

(22) Filed: Apr. 18, 2002

(65) Prior Publication Data

US 2002/0155627 A1 Oct. 24, 2002

(30) Foreign Application Priority Data

Apr. 18, 2001 (JP) ........................................ 2001-120253

(51) Int. Cl.$^7$ ............................................... H01L 21/00
(52) U.S. Cl. .............................. 438/4; 438/59; 438/48; 257/295
(58) Field of Search .............................. 438/3, 59, 594, 438/595, 596, 48, 720, 722, 754; 365/173, 171; 257/295

(56) References Cited

U.S. PATENT DOCUMENTS 6,153,443 A    11/2000   Durlam et al.
6,165,803 A  * 12/2000   Chen et al. ................... 438/3

FOREIGN PATENT DOCUMENTS

JP    07-235016     9/1995
JP    2000-353791   12/2000

\* cited by examiner

*Primary Examiner*—Caridad Everhart
(74) *Attorney, Agent, or Firm*—Katten Muchin Zavis Rosenman

(57) ABSTRACT

A method of manufacturing a magnetic random access memory for excluding stress-induced defects in memory cells. The method is composed of forming a first magnetic film over a substrate, forming a tunnel insulating film on the first magnetic film such that the tunnel insulating film has a curvature, forming a second magnetic film on the tunnel insulating film, and etching the first magnetic film, the tunnel insulating film and the second magnetic film to form a memory cell. The etching is executed such that the curvature is excluded from the memory cell.

15 Claims, 12 Drawing Sheets

METHOD OF FABRICATING MAGNETIC RANDOM ACCESS MEMORY OPERATING BASED ON TUNNEL MAGNETORESISTANCE EFFECT

BACKGROUND OF THE INVENTION

1. Field of the Invention

The present invention relates to a magnetic random access memory (MRAM) and a method of manufacturing the same. More particularly, the present invention relates to an MRAM whose memory cells respectively include two magnetic layers separated by a tunneling barrier layer, and a method of manufacturing the same.

2. Description of the Related Art

An MRAM, which integrates ferromagnetic layers to store digital data, is one of the promising nonvolatile memories. The MRAM stores digital data as directions of spontaneous magnetizations of the ferromagnetic layers. The directions of the spontaneous magnetizations are not reversed until an external magnetic field is applied to the ferromagnetic layers, and this achieves nonvolatile storage of the digital data in the MRAM.

To improve operation and structure of MRAMs, use of the tunnel magnetoresistance (TMR) effect has been proposed. The memory cell whose operation is based on the TMR effect includes two ferromagnetic layers separated by an insulating layer. The insulating layer is so thin that a tunneling current is allowed to pass though the insulating layer. The insulating layer typically has a thickness of about 1.5 nm. The TMR effect causes the resistance of the insulating layer to be changed depending on whether the spontaneous magnetizations of the two magnetic films are "parallel" or "antiparallel". The change in the resistance allows the detection of the data stored in the memory cells.

The method of manufacturing the MRAM based on the TMR effect is disclosed in Japanese Laid Open Patent Application (JP-A 2000-353791). FIGS. 1A, 1B and 1C schematically show the conventional method of manufacturing the MRAM. As shown in FIG. 1A, a silicon oxide film 102, an aluminum film 103, a first magnetic film 104, an insulating film 105 and a second magnetic film 106 are formed in series on a substrate 101. A thickness of the insulating film 105 is so thin that a tunneling current passes through the insulating film 105.

After forming a photoresist 107 on the second magnetic film 106, as shown in FIG. 1B, the second magnetic film 106, the insulating film 105 and the first magnetic film 104 are etched with the photoresist 107 used as a mask. The etching fabricates a lower magnetic layer 104', a tunneling barrier layer 105' and an upper magnetic layer 106'. The lower magnetic layer 104', the tunneling barrier layer 105' and the upper magnetic layer 106' constitute a memory cell. After the formation of the memory cell, as shown in FIG. 1C, the aluminum film 103 is etched to form a lower electrode 103'.

The conventional method causes mechanic stress to be applied to the insulating film 105 and the mechanical stress induces defects in the tunneling barrier layer 105'. The mechanical stress is generated in various ways in the process for manufacturing the MRAM. For example, the fixation of the substrate 101 to a manufacturing apparatus causes mechanical stress to be applied to the tunneling barrier layer 105'. Moreover, thermally-induced mechanical stress is applied to the insulating film 105 because of the difference between thermal expansion coefficients of the substrate 101, the silicon oxide film 102, the lower electrode 103, the first magnetic film 104, the second magnetic film 106 and the insulating film 105. The mechanical stress induces defects in the insulating film 105 and the induced defects may cause operational errors of the MRAM and thus degrade the reliability of the MRAM.

The stress-induced defects are desirably excluded from the tunneling barrier layer in the memory cell.

Another method of manufacturing an MRAM is disclosed in U.S. Pat. No. 6,153,443. In the other conventional method, a tunnel insulating film is discontinuously deposited between two magnetic films.

Furthermore, a method of manufacturing a thin film magnet head, which may be related to the present invention, is disclosed in Japanese Laid Open Patent Application (JP-A-Heisei 7-235016). In the document, it is disclosed that a curved insulating film is formed between two magnet films.

SUMMARY OF THE INVENTION

Therefore, an object of the present invention is to provide a magnetic random access memory for excluding stress-induced defects in a tunneling barrier layer included in a memory cell, and a method of manufacturing the same.

Another object of the present invention is to provide a magnetic random access memory for concentrating a magnetic field to the memory cell during write operation, and a method of manufacturing the same.

In order to achieve an aspect of the present invention, a method of manufacturing a magnetic random access memory is composed of:

forming a first magnetic film over a substrate, forming a tunnel insulating film on the first magnetic film such that the tunnel insulating film has a curvature, forming a second magnetic film on the tunnel insulating film, and etching the first magnetic film, the tunnel insulating film and the second magnetic film to form a memory cell. The etching is executed such that the curvature is excluded from the memory cell.

In order to achieve another aspect of the present invention, a method of manufacturing a magnetic random access memory is composed of:

forming a step-structured member over a substrate, wherein the step-structured member has first and second surfaces substantially parallel to a substrate surface of the substrate, a first distance between the first surface and the substrate surface being different from a second distance between the second surface and the substrate surface;

forming a first magnetic film on the step structure;

forming a tunnel insulating film on the first magnetic film such that the tunnel insulating film has a curvature; and etching a portion of the tunnel insulating film to form a tunneling barrier layer, wherein the whole of the tunneling barrier layer is located over the first surface.

The first distance is preferably larger than the second distance.

The step-structured member preferably has a third surface which bridges the first and second surfaces, the third surface being substantially perpendicular to the first and second surfaces.

In order to achieve still another aspect of the present invention, a method of manufacturing a magnetic random access memory comprising:

forming a conductive portion on a substrate, the conductive portion having a conductive portion surface substantially parallel to a substrate surface at a first distance from the substrate;

forming an insulating portion on the substrate wherein the insulating portion has a insulating portion surface substantially parallel to the substrate at a second distance from the substrate, the first and distances being different from each other;

forming a first magnetic film on the conductive and insulating portions;

forming a tunnel insulating film on the first magnetic film;

forming a second magnetic film on the tunnel insulating film; and etching a portion of the tunnel insulating film to form a tunneling barrier layer wherein the whole of the tunneling barrier layer is located over the conductive portion.

The formation of the insulating portion is preferably executed by the steps of:

forming an insulating film covering the conductive portion;

removing a surface portion of the insulating film to flatten the insulating film; and etching back another portion of the flattened insulating film to form the insulating portion.

The method is preferably further composed of:

forming a magnetic portion between the conductive portion and the substrate.

In order to achieve still another aspect of the present invention, a method of manufacturing a magnetic random access memory is composed of:

forming a step-forming portion over a substrate;

forming a lower electrode to cover the step-forming portion and the substrate such that the lower electrode is protruded in a direction perpendicular to a substrate surface by the step-forming portion;

forming a first magnetic film on an electrode surface of the lower electrode;

forming a tunnel insulating film on the first magnetic film;

forming a second magnetic film on the tunnel insulating film; and etching a portion of the tunnel insulating film to form a tunneling barrier layer. The whole of the tunneling barrier layer is located over the step-forming portion.

The step-forming portion is preferably formed of a magnetic material.

In order to achieve still another aspect of the present invention, an MRAM is composed of a substrate, a step-structured member formed on the substrate, a first magnetic layer formed on the step-structured member, a tunneling barrier layer formed on the first magnetic layer, and a second magnetic layer formed on the step-structured member. The step-structured member has first and second surfaces substantially parallel to a substrate surface of the substrate. A first distance between the first surface and the substrate surface is different from a second distance between the second surface and the substrate surface. The whole of the tunneling barrier layer is located over the first surface.

In order to achieve still another aspect of the present invention, an MRAM is composed of a substrate having a substrate surface, a conductive portion formed on the substrate, an insulating portion formed on the substrate, a first magnetic layer formed on the conductive layer, a tunneling barrier layer formed on the first magnetic layer, and a second magnetic layer formed on the tunneling barrier layer. The conductive portion has a conductive portion surface substantially parallel to the substrate surface, and the insulating portion has an insulating portion surface substantially parallel to the substrate surface. A first distance between the conductive portion surface and the substrate surface is different from a second distance between the insulating portion surface and the substrate surface The MRAM preferably further includes a magnetic portion between the conductive portion and the substrate.

DESCRIPTION OF THE PREFERRED EMBODIMENTS

An MRAM in an embodiment according to the present invention and a method of manufacturing the same will be described below with reference to the attached drawings.

First Embodiment

Figure 1A:
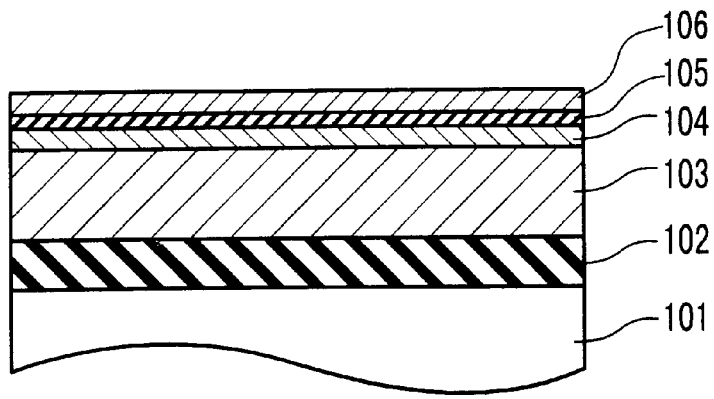
FIGS. 1A, 1B and 1C show a conventional method of manufacturing an MRAM.
Figure 1B:
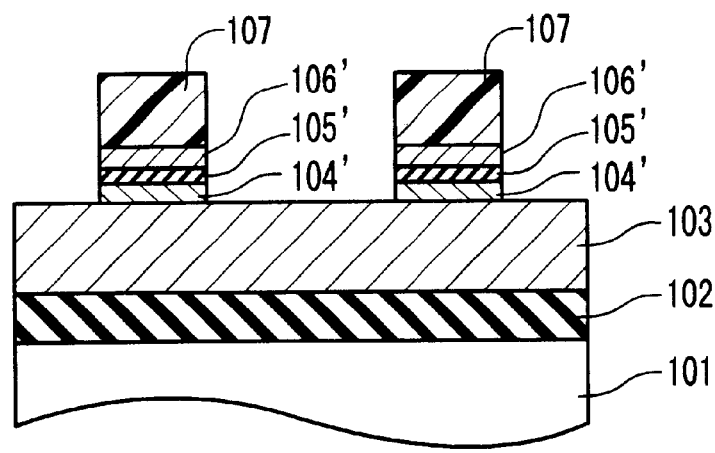
Figure 1C:
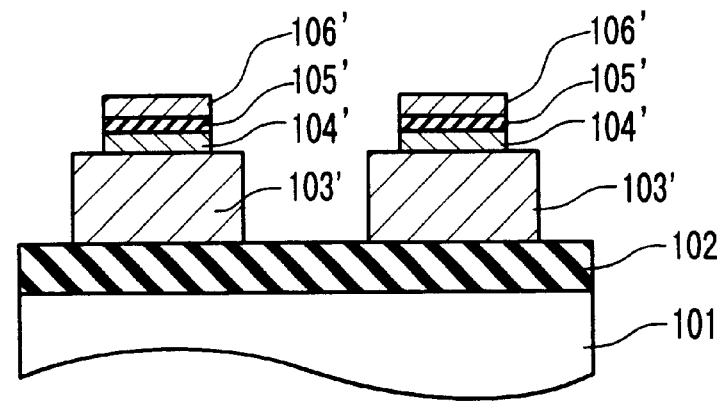
Figure 2A:
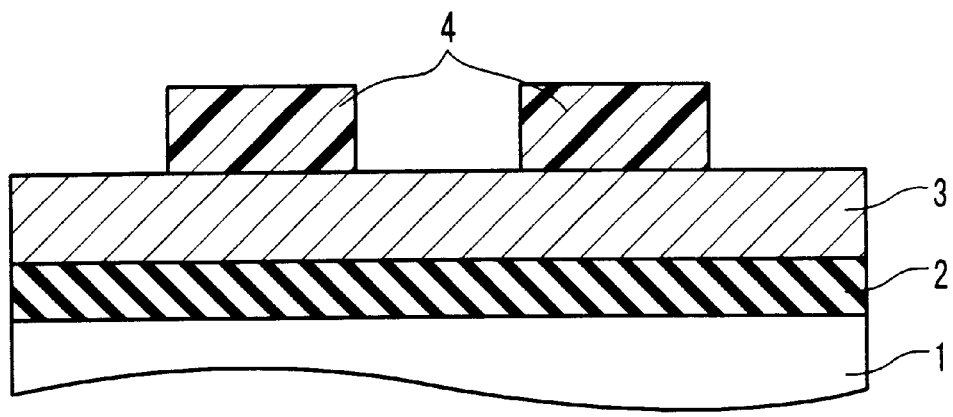
FIGS. 2A, 2B and 2C show a method of manufacturing an MRAM in a first embodiment of the present invention.

As shown in FIG. 2A, the process of manufacturing an MRAM begins with forming an insulation film 2 and a conductive film 3 in series on a substrate 1 in a first embodiment. The insulation film 2 is made of an insulator such as oxide silicon film and oxide nitride silicon. The conductive film 3 is made of conductive material, such as aluminum, copper and nitride titanium. A resist 4 is then formed on the conductive film 3.

Figure 2B:
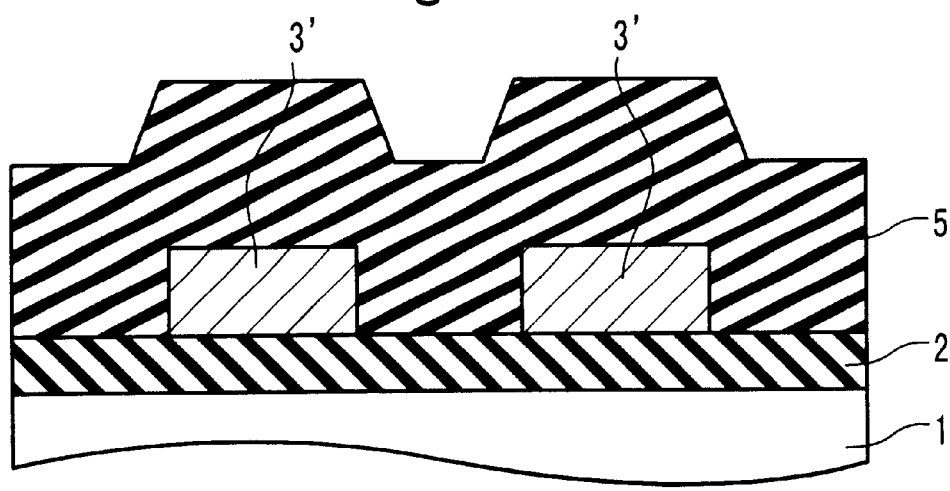

As shown in FIG. 2B, the conductive film 3 is then etched with the resist 4 as mask to form lower electrodes 3'. Then, an insulating film 5 is deposited by a high-density plasma CVD technique to cover the lower electrodes 3'.

Figure 2C:
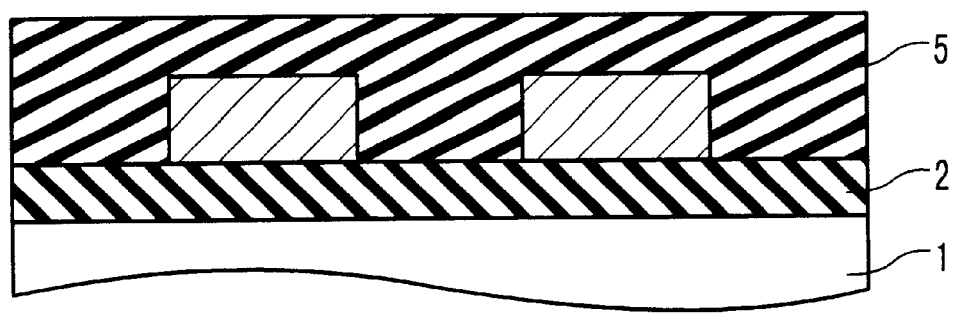

After the deposition of the insulating film 5, the insulating film 5 is flattened by a CMP (Chemically Mechanically Polishing) technique as shown in FIG. 2C.

Figure 3A:
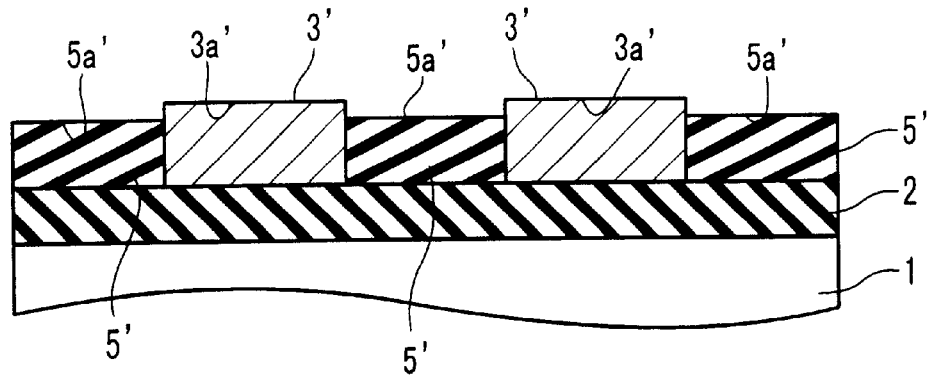
FIGS. 3A, 3B, 3C, and 3D show a method of manufacturing an MRAM in a first embodiment of the present invention.

As shown in FIG. 3A, the insulating film 5 is then etched back from the upper side of the substrate 1. The etch-back is carried out by reactive ion etching with fluorocarbon gas as an etchant. The etch-back of the insulating film 5 exposes entire surfaces 3a' of the lower electrodes 3' and makes the thickness of the insulating film 5 thinner than those of the lower electrodes 3'. Hereafter, the etched back insulating film 5 is referred to as an insulator 5'. The surfaces 3a' of the lower electrodes 3' and a surface 5a' of the insulator 5' are substantially parallel to the surface of the substrate 1.

The lower electrodes 3', which are made of a conductive material, are not etched in the reactive ion etching with the fluorocarbon gas, and thus the lower electrodes 3' and the insulator 5' form a step in the contact region thereof. That is, after the etch-back, a distance between the surfaces 3a' and a surface 1a of the substrate 1 is different from a distance between the surface 5a' and the surface 1a. The distance between the surfaces 3a' and the surface 1a is larger than the distance between the surface 5a' and the surface 1a.

The step formed by the lower electrodes 3' and the insulator 5' should be as large as preferable step coverage is obtained. An excessively large step causes poor step coverage of an interlayer dielectric formed in the following fabrication process.

Figure 3B:
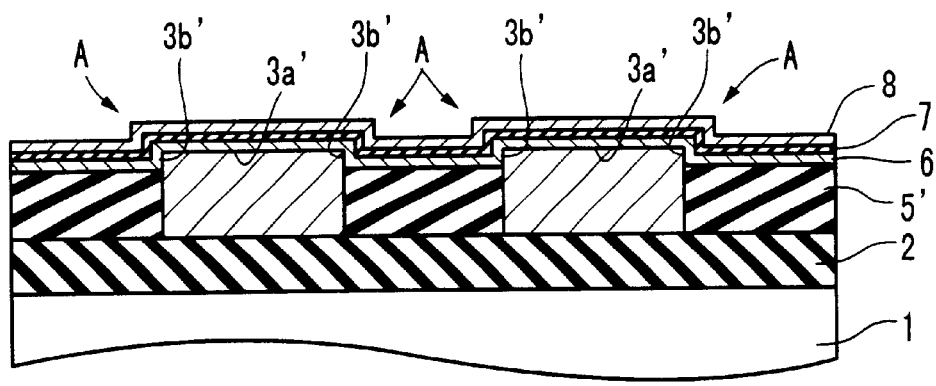

As shown in FIG. 3B, a first magnetic film 6, a tunneling barrier insulator 7, and a second magnetic film 8 are formed in series to cover the lower electrodes 3' and the insulator 5'. The first magnetic film 6 and the second magnetic film 8 are made of metallic ferromagnetic material such as iron, nickel, cobalt and permalloy (NiFe). The tunneling barrier insulator 7 is made of an insulator such as alumina ($Al_2O_3$) and hafnium oxide. A thickness of the tunneling barrier insulator 7 is so thin that a tunneling current passes through the tunneling barrier insulator 7. The thickness of the tunneling barrier insulator 7 is typically about 1.5 nm. Alumina is a preferable material for the tunneling barrier insulator 7 because of its excellent insulating property and its easiness to form a thin film.

The first magnetic film 6 and the second magnetic film 8 may be a laminated magnetic film formed of a ferromagnetic film(s) and a non-magnetic film, such as ruthenium film. Also, the first magnetic film 6 and the second magnetic film 8 may be a laminated magnetic film formed of a ferromagnetic film and a diamagnetic film such as iridium manganese, and platinum manganese. Also, the first magnetic film 6 and the second magnetic film 8 may be a laminated magnetic film formed of a ferromagnetic film, non-magnetic film and diamagnetic film.

The step constructed by the lower electrodes 3' and the insulator 5' forms curvatures A in the first magnetic film 6, the tunneling barrier insulator 7 and the second magnetic film 8.

The curvatures A suppress induction of defects in tunneling-current-flowing portions of the tunneling barrier insulator 7, the portions that are located over the surfaces 3a' of the lower electrodes 3' and pass through the tunneling current. The curvatures A concentrate the mechanical stress thereon, and thus weaken the mechanical stress applied to the tunneling-current-flowing portions. This effectively prevents defects from being induced in the tunneling-current-flowing portions.

Side surfaces 3b' of the lower electrodes 3' which are in contact with the first magnetic film 6 are desired to be substantially vertical to the surface 5a' of the insulating film 5 and the surfaces 3a' of the lower electrodes 3'. The vertical side surfaces 3b' decrease the curvature radius of the curvatures A, and thereby further concentrates the mechanical stress onto the curvatures A. The curvatures A are clearly shown in FIG. 3D which is an enlargement of a right portion of FIG. 3B.

Figure 3C:
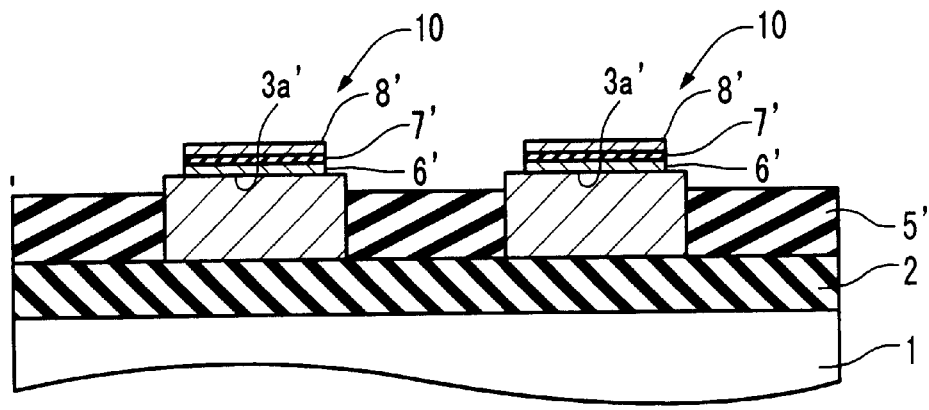
Figure 3D:
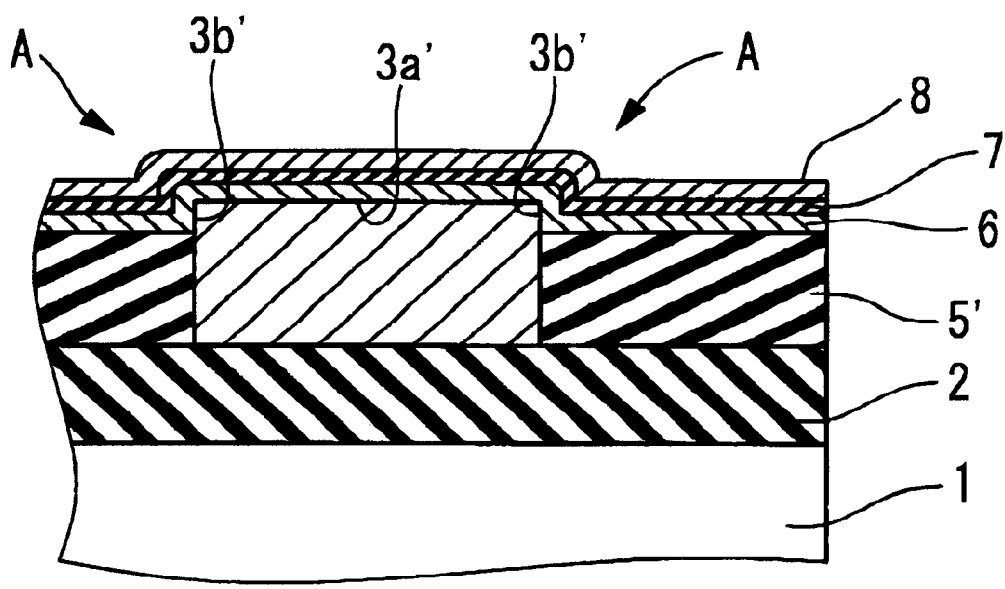

As shown in FIG. 3C, the second magnetic film 8, the tunneling barrier insulator 7 and the first magnetic film 6 are then etched to form free (soft) ferromagnetic layers 8', a tunneling barrier layers 7' and fixed (pinned) ferromagnetic layers 6'. The fixed ferromagnetic layers 6', the tunneling barrier layers 7' and the free ferromagnetic layers 8' constitute TMR elements 10 in which magnetic tunnel junctions are accommodated. The etching of the second magnetic film 8, the tunneling barrier insulator 7 and the first magnetic film 6 is executed such that the curvatures A are excluded from the TMR elements 10. Only the portions of the first magnetic film 6, the tunneling barrier insulator 7 and the second magnetic film 8 located on or over the surfaces 3a' of the lower electrodes 3' remain after the etching. The curvatures A weaken the mechanical stress applied to the remaining portions and thus make the remaining portions substantially defect-free. The exclusion of the curvatures A allows the defect-free portions to be used as the tunneling barrier layer 7'.

Figure 4A:
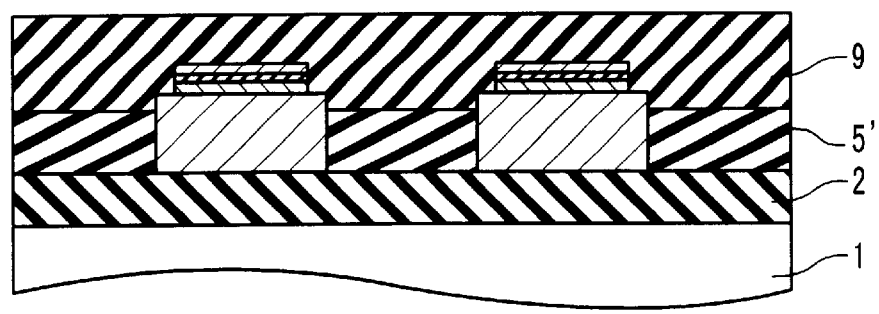
FIGS. 4A and 4B show a method of manufacturing an MRAM in a first embodiment of the present invention.

As shown in FIG. 4A, an interlayer dielectric 9 is then formed to cover the entire structure. The interlayer dielectric 9 is made of an insulator such as silicon oxide. The insulator 5', which is filled around the lower electrode 3', improves the step coverage of the interlayer dielectric 9.

Figure 4B:
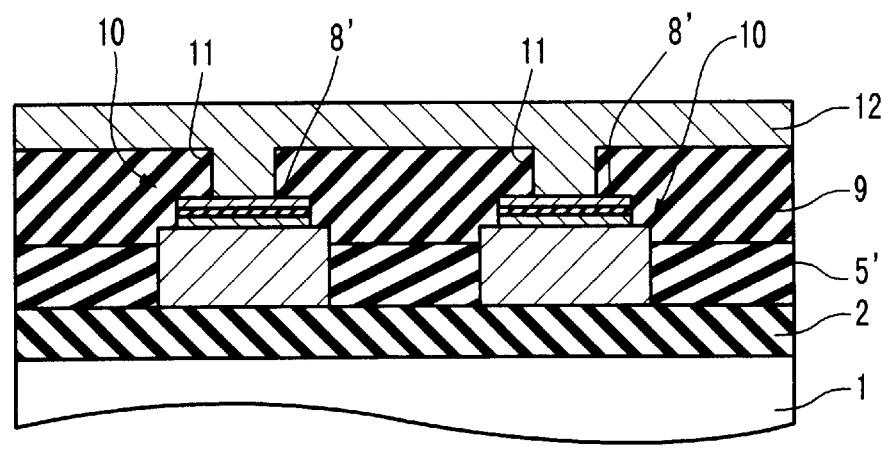

As shown in FIG. 4B, contact holes 11 are then formed to expose portions of the free ferromagnetic layers 8'. An upper wiring 12 is then formed of conductive material such as aluminum and copper. The upper wiring 12 is connected to the free ferromagnetic layers 8' through the contact holes 11. The formation of upper wiring 12 completes the fabrication process of the MRAM.

The method of manufacturing the MRAM in the first embodiment reduces stress-induced defects included in the tunneling barrier layers 7', and thus improves the reliability of the MRAM. As mentioned above, the first magnetic film 6, the tunneling barrier insulator 7 and the second magnetic film 8 are formed on the step constructed by the lower electrodes 3' and the insulator 5'. The step provides the curvatures A with the tunneling barrier insulator 7. The mechanical stress applied to the tunneling barrier insulator 7 is concentrated onto the curvatures A. This weakens the mechanical stress applied to portions of the tunneling barrier insulators 7, the portions that are formed into the tunneling barrier layer 7'. This enables to reduce the stress-induced defects included in the tunneling barrier layer 7'.

In the view of the reduction of stress-induced defects, the insulator 5' may be thicker than the lower electrode 3'. It is preferable, however, that the lower electrode 3', on which the TMR element 10 is fabricated, is thicker than the insulator 5' for improving the uniformity of the first magnetic film 6, the tunneling barrier insulator 7 and the second magnetic film 8. If the insulator 5' is thicker than the lower electrode 3', the uniformity in the film thicknesses of the first magnetic film 6, the tunneling barrier insulator 7 and the second magnetic film 8 are made poor because of the presence of the insulator 5'. The poor uniformity causes the property of the TMR element to be deteriorated. Thus, it is preferable that the lower electrode is thicker than the insulator 5'.

Second Embodiment

FIGS. 5A to 5C and FIG. 6 show a method of manufacturing an MRAM in a second embodiment. The method of manufacturing the MRAM in the second embodiment suppresses the induction of defects in tunneling barrier layer. Moreover, the method in the second embodiment enables to fabricate an MRAM in which a magnetic field used to write data is easily concentrated onto the free ferromagnetic layer in the memory cell.

Figure 5A:
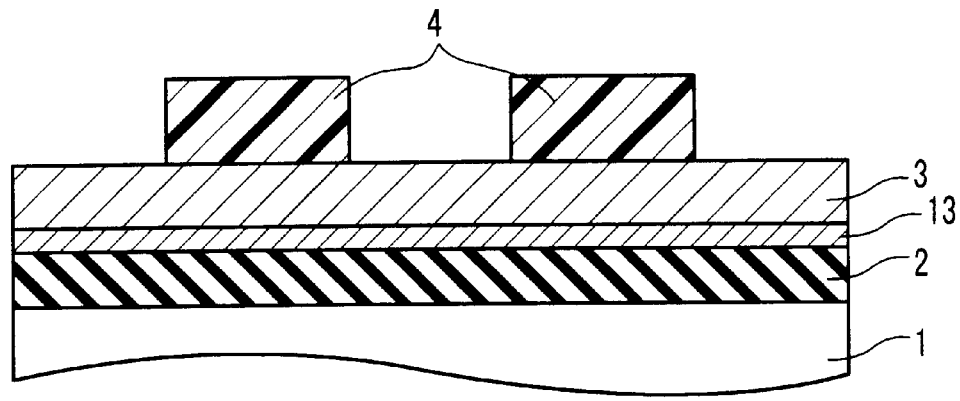
FIGS. 5A, 5B and 5C show a method of manufacturing an MRAM in a second embodiment of the present invention.

As shown in FIG. 5A, the fabrication method in the second embodiment begins with successive depositions of a lower magnetic film 13, the insulation film 2 and the conductive film 3 to cover the substrate 1. The lower magnetic film 13 is made of the magnetic material having a high magnetic permeability, such as iron, nickel, cobalt, or alloys of these, such as permalloy (NiFe). The insulation film 2 is made of the insulator such as oxide silicon film and oxide nitride silicon. The conductive film 3 is made of the conductive material, such as aluminum, copper and nitride titanium. The resist 4 is then formed on the conductive film 3.

Figure 5B:
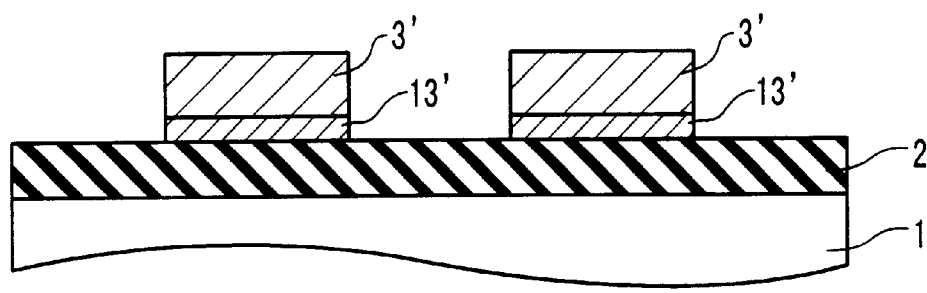

As shown in FIG. 5B, with the resist 4 as the mask, the conductive film 3 and the lower magnetic film 13 are etched to accordingly form the lower electrodes 3' and lower magnetic members 13'. When a current is applied to one of the lower electrodes 3', the associated lower magnetic members 13' functions as a magnetic path of a magnetic field generated by the applied current.

Figure 5C:
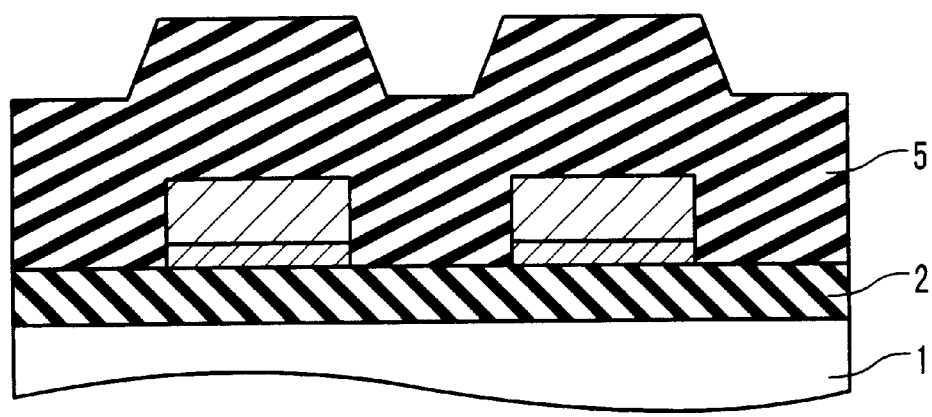

The insulating film 5 is then formed to cover the lower electrodes 3' and the lower magnetic members 13', as shown in FIG. 5C. After the insulating film 5 is flattened, the same processes as the first embodiment are carried out to accordingly form the MRAM.

Figure 6:
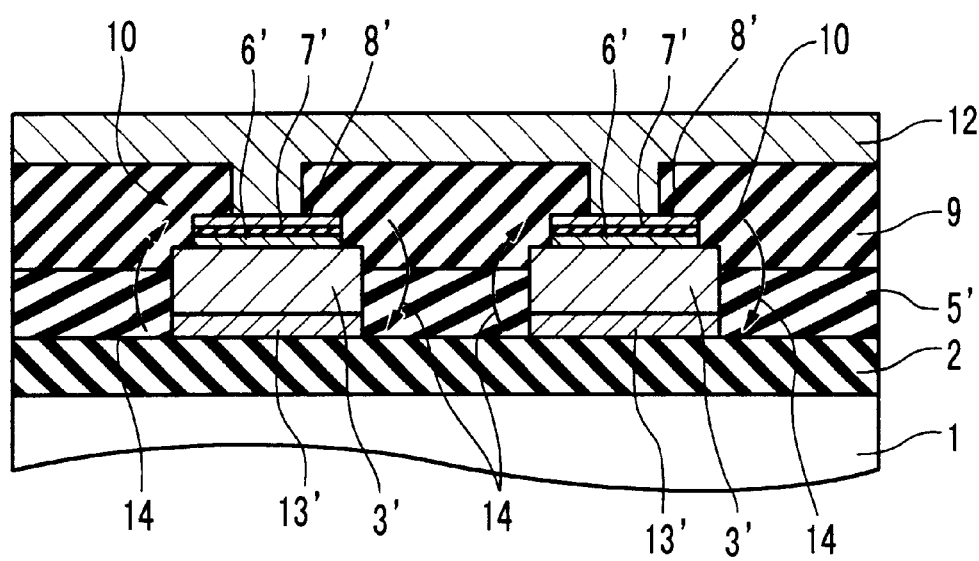
FIG. 6 shows a structure of an MRAM, which is manufactured by the method of manufacturing the MRAM in the second embodiment.

FIG. 6 shows the structure of the MRAM fabricated by the method in the second embodiment. The lower magnetic members 13' are formed between the insulation film 2 and the lower electrodes 3'. The lower magnetic members 13' have a higher magnetic permeability than the substrate 1, the insulation film 2, the insulator 5' and the interlayer dielectric 9. The TMR element 10, which includes the fixed ferromagnetic layer 6', the tunneling barrier layer 7' and the free ferromagnetic layer 8', is formed on the lower electrode 3'.

In the method of manufacturing the MRAM in the second embodiment, the stress-induced defects are effectively excluded from the tunneling barrier layer 7' in the TMR element 10.

In addition, the method of manufacturing the MRAM in the second embodiment enables to manufacture an MRAM that requires small current to write data into the TMR element 10. As mentioned above, the lower magnetic members 13' having a high magnetic permeability attract the magnetic field 14 generated by the current applied to the lower electrodes 3' to the vicinity of the lower electrode 3'. This concentrates the magnetic field 14 onto the TMR element 10. The concentration of the magnetic field 14 enables to reduce the current flowing through the lower electrode 3'.

Third Embodiment

FIGS. 7A to 7C and 8A to 8C show a method of manufacturing an MRAM in a third embodiment. The method of manufacturing the MRAM in the third embodiment suppresses the induction of the defects in the tunneling barrier layer in the same way as the second embodiment. Moreover, the MRAM is configured such that the magnetic field used for data write is concentrated onto the memory cell.

The method in the third embodiment differs from that in the second embodiment in that the step used to form the curvatures is formed in a different process.

Figure 7A:
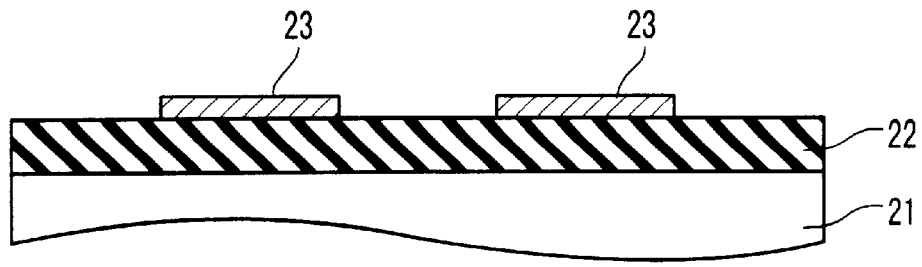
FIGS. 7A, 7B and 7C show a method of manufacturing an MRAM in a third embodiment.

The fabrication method in the third embodiment begins with forming an insulation film 22 on a substrate 21 as shown in FIG. 7A. The insulation film 22 is made of an insulator such as silicon oxide and silicon oxinitride. After a magnetic film is formed on the insulation film 22, the magnetic film is etched to form magnetic members 23. The magnetic members 23 are formed of a magnetic material having a high magnetic permeability, such as iron, nickel, cobalt, and alloys such as permalloy (NiFe).

Figure 7B:
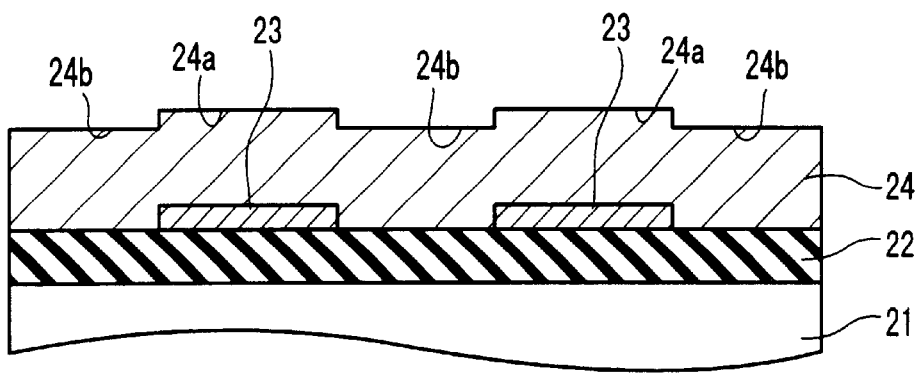

After forming the magnetic members 23, a lower wiring 24 is formed as shown in FIG. 7B. The lower wiring 24 is formed to cover the insulation film 22 and the magnetic members 23. The magnetic members 23 are inserted between the lower wiring 24 and the insulation film 22 and thus a part of the lower wiring 24 is protruded by a thickness of the magnetic members 23. The protrusion of the lower wiring 24 results in that a step is formed in the lower wiring 24. A distance between the insulation film 22 and a partial surface 24a, which is a part of the surface of the lower wiring 24 located over the magnetic members 23, is larger than that between the insulation film 22 and a partial surface 24b, which is a part of the surface of the lower wiring 24 off-aligned to the magnetic members 23.

Figure 7C:
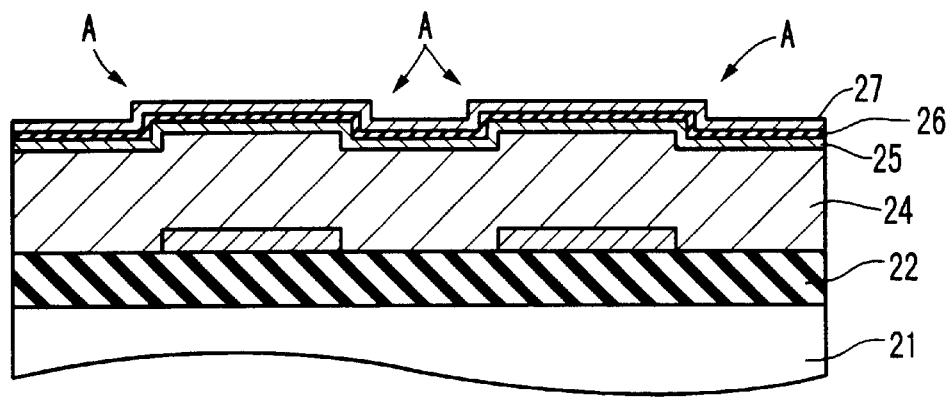

A first magnetic film 25, a tunneling barrier insulator 26 and a second magnetic film 27 are then formed in series to cover the lower wiring 24, as shown in FIG. 7C. The first magnetic film 25 and the second magnetic film 27 are made of the metallic ferromagnetic material such as iron, nickel, cobalt and permalloy (NiFe). The tunneling barrier insulator 26 is made of the insulator such as alumina ($Al_2O_3$) and hafnium oxide.

The step formed in the lower wiring 24 provides curvatures A for the first magnetic film 25, the tunneling barrier insulator 26 and the second magnetic film 27. The curvatures A concentrates mechanical stress applied to the tunneling barrier insulator 26 thereon, and thus weakens the mechanical stress applied to the tunneling-current passing portions of the tunneling barrier insulator 26, the portions being located on or over the partial surface 24a. This reduces stress-induced defects included in the tunneling-current passing portions.

Figure 8A:
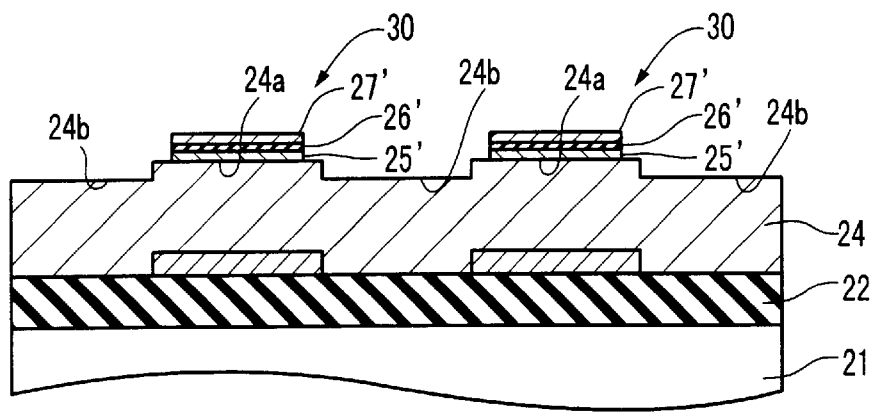
FIGS. 8A, 8B and 8C show a method of manufacturing an MRAM in a third embodiment.

As shown in FIG. 8A, the second magnetic film 27, the tunneling barrier insulator 26 and the first magnetic film 25 are then etched to form free ferromagnetic layers 27', a tunneling barrier layers 26' and fixed ferromagnetic layers 25'. The layers 25', 26' and 27' constitute TMR elements 30. The etching is executed so that the curvatures A are excluded from the free ferromagnetic layers 27', the tunneling barrier layers 26' and the fixed ferromagnetic layers 25'. Only the portions of the first magnetic film 25, the tunneling barrier insulator 26 and the second magnetic film 27, the portions being located over the magnetic member 23 remains as the fixed ferromagnetic layers 25', the tunneling barrier layers 26' and the free ferromagnetic layers 27'. The exclusion of the curvatures A reduces stress-induced defects included in the tunneling barrier layers 26' of the TMR elements 30.

Figure 8B:
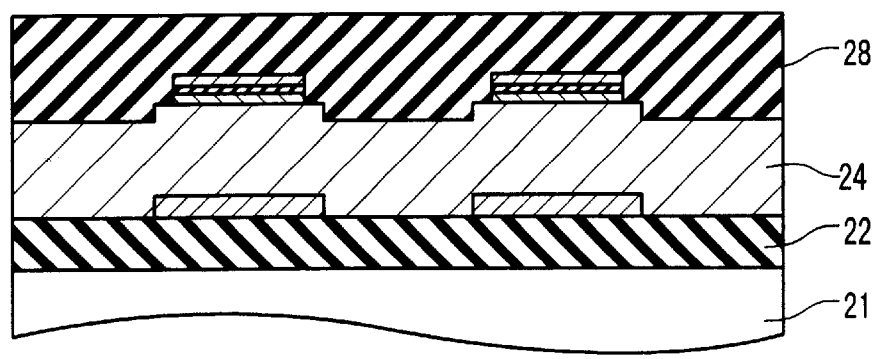

An interlayer dielectric 28 is then deposited to cover the entire structure as shown in FIG. 8B. The interlayer dielectric 28 is made of the insulator such as oxide silicon.

Figure 8C:
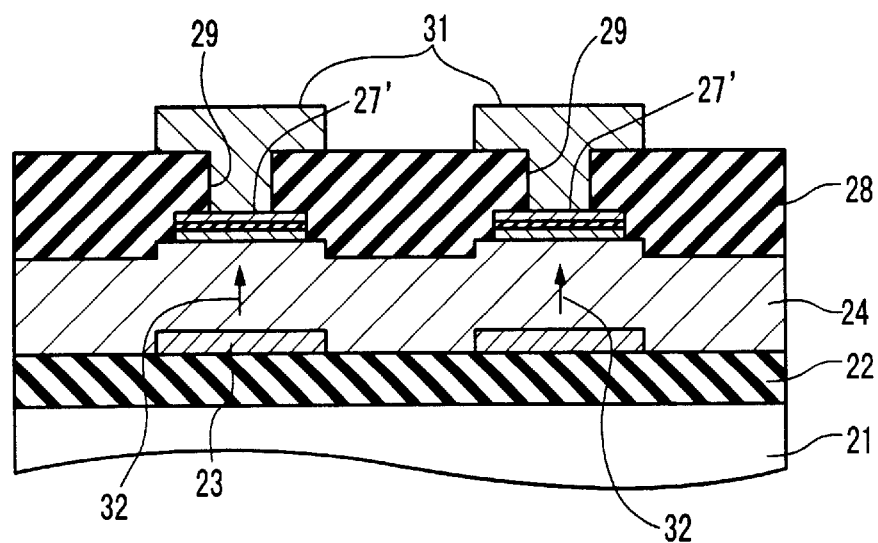

After the deposition of the interlayer dielectric 28, contact holes 29 is formed to expose portions of the free ferromagnetic layer 27' as shown in FIG. 8C. An upper wiring 31 is then formed of the conductive material such as aluminum and copper. The upper wiring 31 is connected to the free ferromagnetic layers 27' through the contact holes 29. The formation of upper wiring 31 completes the fabrication process of the MRAM.

The method of manufacturing the MRAM in the third embodiment effectively excludes the stress-induced defects from tunneling barrier layer 26' in the same way as the methods in the first and second embodiment.

Moreover, the method of manufacturing the MRAM in the third embodiment enables to manufacture the MRAM that requires small current to execute data write. As mentioned above, the magnetic members 23 having a high magnetic permeability attract the magnetic field 32 to the vicinity of the lower wiring 24. The attracted magnetic field 32 is concentrated onto the TMR elements 30. The concentration of the magnetic field 32 onto the TMR elements 30 reduces the current required for writing data.

In the third embodiment, non-magnetic members made of non-magnetic material, such as oxide silicon and copper, may be used instead of the magnetic members 23. This also enables to reduce stress-induced defects included in the tunneling barrier layers 26' while the effect of the concentration of the magnetic field 32 on the TMR elements 30 is not obtained. The non-magnetic members may be insulators such as oxide silicon and may be a conductive material, such as aluminum and copper.

Fourth Embodiment

FIGS. 9A to 9C and 10A to 10C show a method of manufacturing an MRAM in a fourth embodiment. In the fourth embodiment, the memory cell is formed on the bottom of the step structure, while the memory cell is formed on the top of the step structure in the first to third embodiments.

Figure 9A:
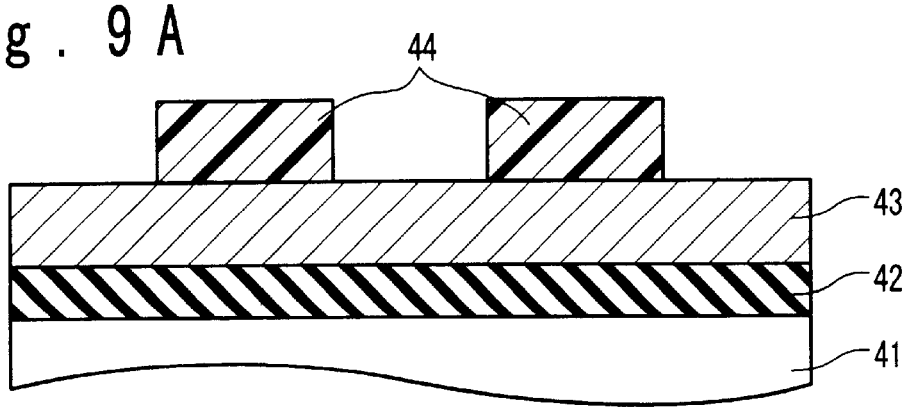
FIGS. 9A, 9B, 9C and 9D show a method of manufacturing an MRAM in a fourth embodiment.

As shown in FIG. 9A, the fabrication process in the fourth embodiment begins with successive depositions of insulation film 42 and a conductive film 43 to cover a substrate. The insulation film 42 is made of an insulator such as silicon oxide and silicon oxinitride. The conductive film 43 is made of a conductive material such as aluminum, copper and nitride titanium. A resist 44 is then formed on the conductive film 43.

Figure 9B:
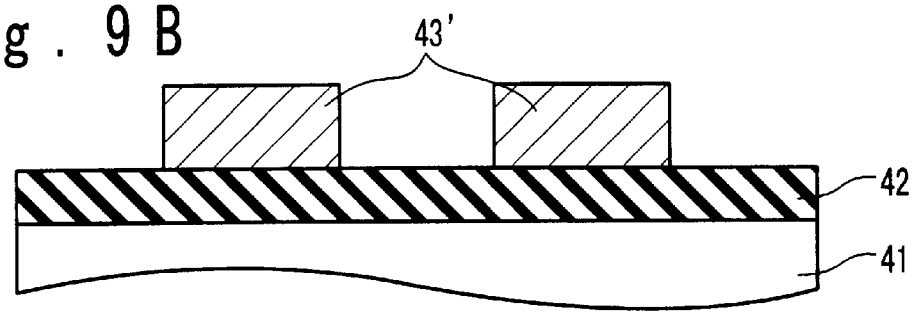

As shown in FIG. 9B, the conductive film 43 is then etched with the resist 44 as the mask to accordingly form lower electrodes 43'.

Figure 9C:
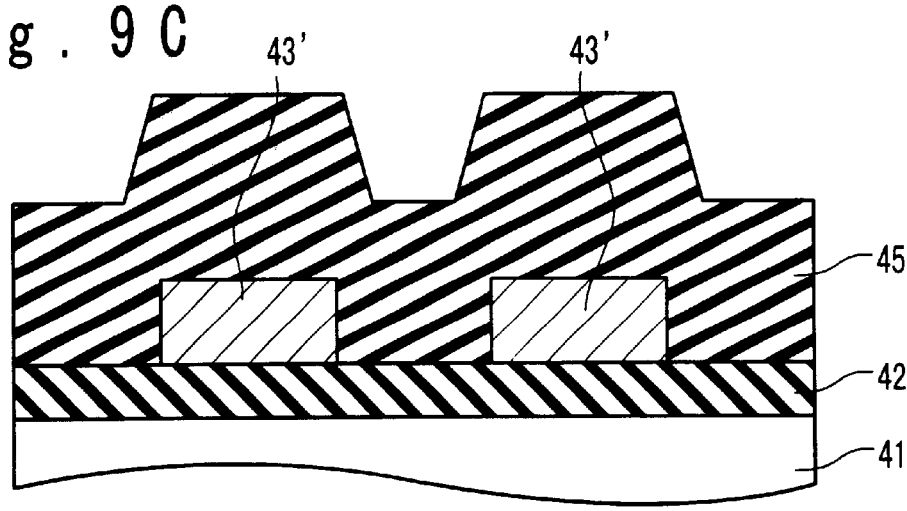

Next, an insulation film 45 is deposited to cover the entire structure, as shown in FIG. 9C. The insulation film 45 is made of the insulator such as oxide silicon.

Figure 9D:
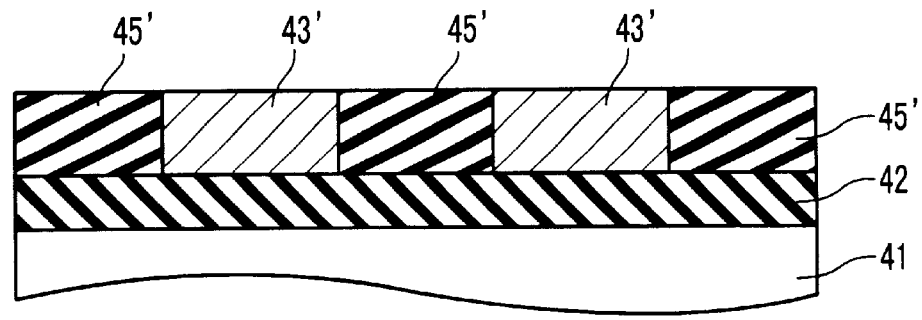

After the deposition of the insulation film 45, as shown in FIG. 9D, the insulation film 45 is flattened by a CMP technique. A surface portion of the insulation film 45 is removed to expose the surfaces of the lower electrodes 43'. The polishing of the insulation film 45 is executed such that the polished surface thereof is substantially aligned with the surfaces of the lower electrodes 43'. Hereafter, the polished insulation film 45 is referred to as an insulator 45'.

Figure 10A:
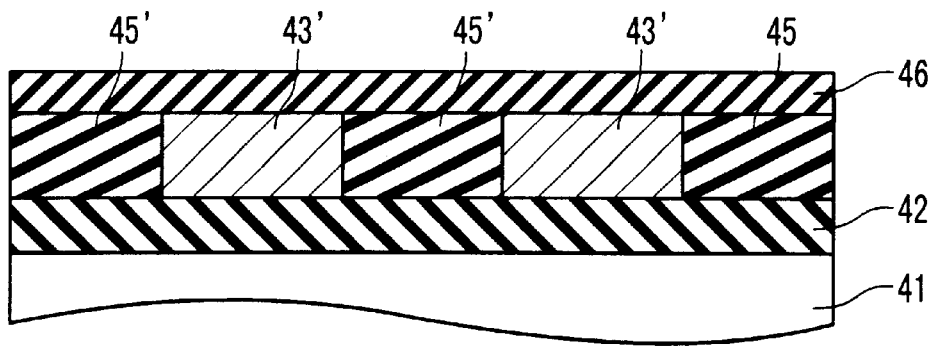
FIGS. 10A, 10B and 10C show a method of manufacturing an MRAM in a fourth embodiment.

As shown in FIG. 10A, an insulation film 46 is formed to cover the lower electrodes 43' and the insulator 45'. The insulation film 46 is formed of an insulator whose etching selectivity is high with respect to both the lower electrodes 43' and the insulator 45'. When the lower electrodes 43' are made of aluminum and the insulator 45' is made of oxide silicon, the insulation film 46 is typically made of silicon nitride.

Figure 10B:
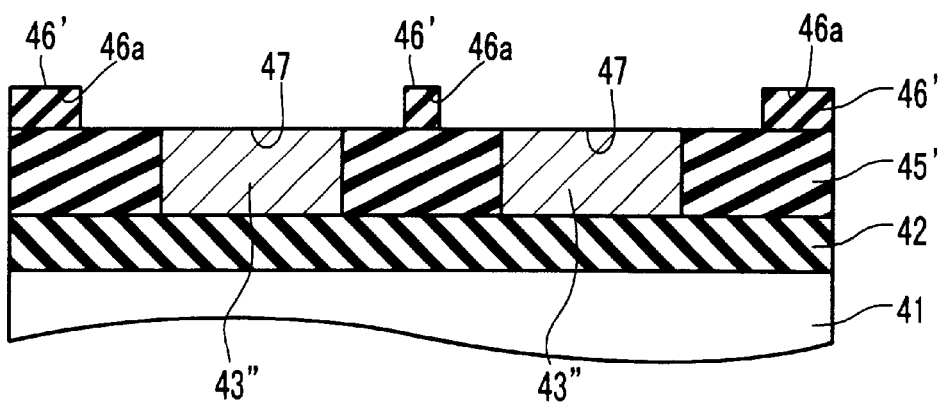

As shown in FIG. 10B, the insulation film 46 is then etched to accordingly form a step-forming member 46'. The etching of the insulation film 46 exposes a part of the surfaces of the insulator 45' and the entire upper surface of the lower electrodes 43'. The surfaces of the lower electrodes 43' and the insulator 45' exposed by the etching are hereafter referred to as an exposed surface 47. A step structure is formed by the step-forming member 46'. That is, an upper surface 46a of the step-forming member 46' is located farther from the substrate 41 than the exposed surface 47.

Figure 10C:
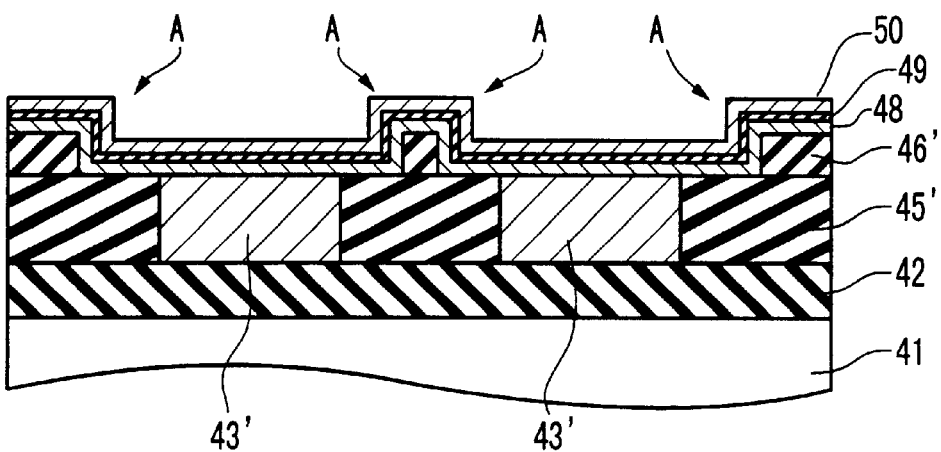

As shown in FIG. 10C, a first magnetic film 48, a tunnel insulation film 48 and a second magnetic film 50 are then formed in series to cover the entire structure. The first magnetic film 48 and the second magnetic film 50 are made of the metallic ferromagnetic material such as iron, nickel, cobalt and permalloy (NiFe). The tunneling barrier insulator 49 is made of the insulator such as alumina ($Al_2O_3$) and oxide hafnium.

The step-forming member 46' provides curvatures A for the first magnetic film 48, the tunneling barrier insulator 49 and the second magnetic film 50. The mechanical stress applied to the tunneling barrier insulator 49 is thus concentrated onto the curvatures A. The concentration of the mechanical stress weakens the mechanical stress applied to the tunnel-current passing portions of the tunneling barrier insulator 49, the portions being located over the lower electrode 43'. This effectively reduces the stress-induced defects in the tunnel-current passing portions.

Figure 11A:
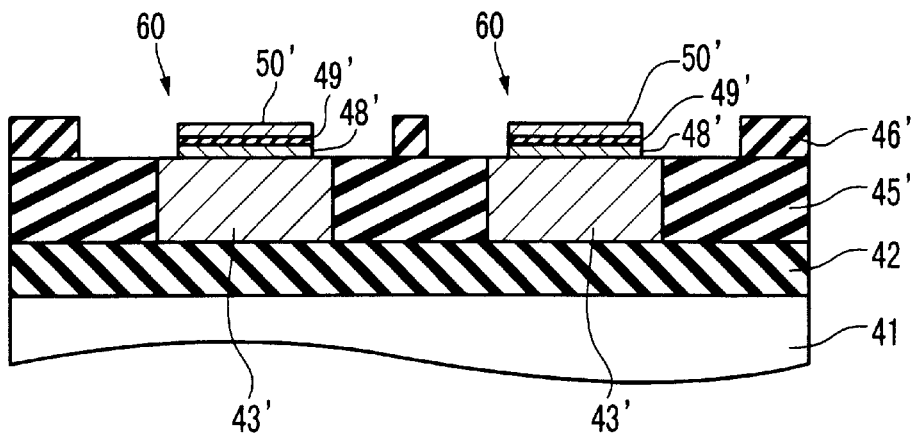
FIGS. 11A, 11B and 11C show a method of manufacturing an MRAM in a fourth embodiment.

As shown in FIG. 11A, the second magnetic film 50, the tunneling barrier insulator 49 and the first magnetic film 48 are then etched to form free ferromagnetic layers 50', tunneling barrier layer 49' and fixed ferromagnetic layers 48'. The fixed ferromagnetic layers 48', the tunneling barrier layers 49' and the free ferromagnetic layers 50' constitute TMR elements 60. The etching of the second magnetic film 50, the tunneling barrier insulator 49 and the first magnetic film 48 is executed so that the curvatures A are excluded from the ferromagnetic layer 50', the tunneling barrier layer 49' and the fixed ferromagnetic layer 48'. That is, only the portions of the first magnetic film 48, the tunneling barrier insulator 49 and the second magnetic film 50, located on or over the surface of the lower electrode 43' remain to form the free ferromagnetic layers 50', the tunneling barrier layers 49' and the fixed ferromagnetic layers 48'. The exclusion of the curvatures A enables to reduced stress-induced defects included in the tunneling barrier layer 49'.

Figure 11B:
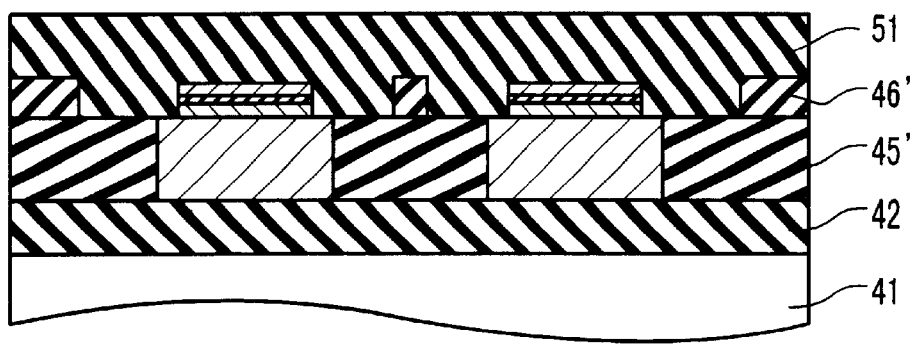

An interlayer dielectric 51 is then formed to cover the entire structure, as shown in FIG. 11B. The interlayer dielectric 51 is made of the insulator such as oxide silicon.

Figure 11C:
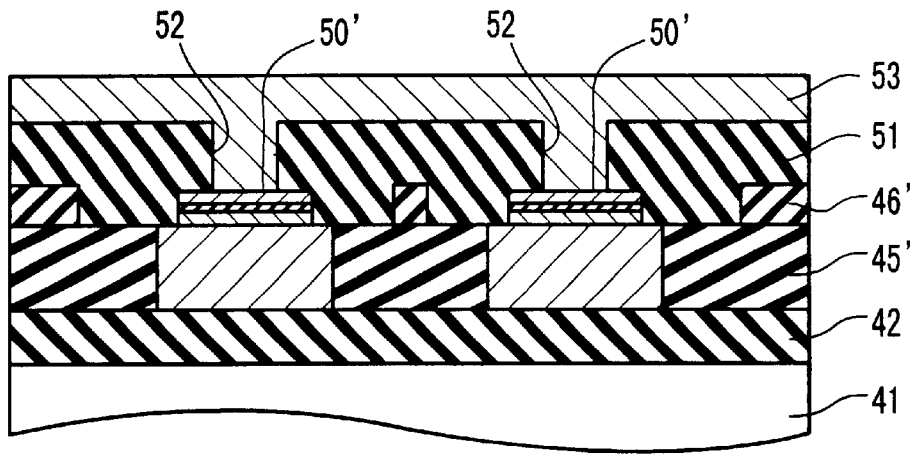

Contact holes 52 are then formed to expose portions of the free ferromagnetic layers 50' as shown in FIG. 11C. An upper wiring 53 is then formed to be connected to the free ferromagnetic layers 50' through the contact holes 52. The upper wiring 53 is made of conductive material such as aluminum and copper. The formation of the upper wiring 53 completes the fabrication process of the MRAM.

In the method of manufacturing the MRAM in the fourth embodiment, the first magnetic film 48, the tunneling barrier insulator 49 and the second magnetic film 50 are formed on a step structure. The step structure provides the curvatures A for the first magnetic film 48, the tunneling barrier insulator 49 and the second magnetic film 50. The mechanical stress applied to the tunneling barrier insulator 49 is concentrated onto the curvatures A. The concentration of the mechanical stress weakens the mechanical stress applied to the portions of the tunneling barrier insulator 49, the portions which are formed into the tunneling barrier layers 49', and this reduces the stress-induced defects included in the tunneling barrier layers 49'. The reduction of the stress-induced defects improves the reliability of the MRAM.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A method of manufacturing a magnetic random access memory comprising:

forming a first magnetic film over a substrate;

forming a tunnel insulating film on said first magnetic film such that said tunnel insulating film has a curvature;

forming a second magnetic film on said tunnel insulating film; and etching said first magnetic film, said tunnel insulating film and said second magnetic film to form a memory cell, wherein said etching is executed such that said curvature is excluded from said memory cell.

2. A method of manufacturing a magnetic random access memory comprising:

forming a step-structured member over a substrate, wherein said step-structured member has first and second surfaces substantially parallel to a substrate surface of said substrate, a first distance between said first surface and said substrate surface being different from a second distance between said second surface and said substrate surface;

forming a first magnetic film o n said step structure;

forming a tunnel insulating film on said first magnetic film such that said tunnel insulating film has a curvature; and etching a portion of said tunnel insulating film to form a tunnel insulating layer, wherein the whole of said tunnel insulating layer is located over said first surface.

3. The method according to claim 2, wherein said first distance is larger than said second distance.

4. The method according to claim 2, wherein said step-structured member has a third surface which bridges said first and second surfaces, and said third surface is substantially perpendicular to said first and second surfaces.

5. A method of manufacturing a magnetic random access memory comprising:

forming a conductive portion on a substrate, wherein said conductive portion has a conductive portion surface substantially parallel to a substrate surface at a first distance from said substrate;

forming an insulating portion on said substrate wherein said insulating portion has a insulating portion surface substantially parallel to said substrate at a second distance from said substrate, said first and distances being different from each other;

forming a first magnetic film on said conductive and insulating portions;

forming a tunnel insulating film on said first magnetic film;

forming a second magnetic film on said tunnel insulating film; and etching a portion of said tunnel insulating film to form a tunnel insulating layer wherein the whole of said tunnel insulating layer is located over said conductive portion.

6. The method according to claim 5, wherein said first distance is larger than said second distance.

7. The method according to claim 5, wherein said forming said insulating portion includes:

forming an insulating film covering said conductive portion;

removing a surface portion of said insulating film to flatten said insulating film; and etching back another portion of said flattened insulating film to form said insulating portion.

8. The method according to claim 5, further comprising:

forming a magnetic portion between said conductive portion and said substrate.

9. A method of manufacturing a magnetic random access memory comprising:

forming a step-forming portion over a substrate;

forming a lower electrode to cover the step-forming portion and said substrate such that said lower electrode is protruded in a direction perpendicular to a substrate surface by said step-forming portion;

forming a first magnetic film on an electrode surface of said lower electrode;

forming a tunnel insulating film on said first magnetic film;

forming a second magnetic film on said tunnel insulating film; and etching a portion of said tunnel insulating film to form a tunnel insulating layer, wherein the whole of said tunnel insulating layer is located over said step-forming portion.

10. The method according to claim 9, wherein said step-forming portion is formed of a magnetic material.

11. An MRAM comprising:

a substrate;

a step-structured member formed on said substrate, wherein said step-structured member has first and second surfaces substantially parallel to a substrate surface of said substrate, a first distance between said first surface and said substrate surface being different from a second distance between said second surface and said substrate surface;

a first magnetic layer formed on said step-structured member;

a tunnel insulating layer formed on said first magnetic layer; and a second magnetic layer formed on said step-structured member, wherein the whole of said tunnel insulating layer is located over said first surface.

12. The MRAM according to claim 11, wherein said first distance is larger than said second distance.

13. An MRAM comprising:

a substrate having a substrate surface;

a conductive portion formed on said substrate, said conductive portion having a conductive portion surface substantially parallel to said substrate surface;

an insulating portion formed on said substrate, said insulating portion having an insulating portion surface substantially parallel to said substrate surface;

a first magnetic layer formed on said conductive layer;

a tunnel insulating layer formed on said first magnetic layer;

a second magnetic layer formed on said tunnel insulating layer, wherein a first distance between said conductive portion surface and said substrate surface is different from a second distance between said insulating portion surface and said substrate surface.

14. The MRAM according to claim 13, wherein said first distance is larger than said second distance.

15. The MRAM according to claim 13, further comprising:

a magnetic portion between said conductive portion and said substrate.

* * * * *